(12) United States Patent
Sampath

(10) Patent No.: US 6,400,164 B1
(45) Date of Patent: Jun. 4, 2002

(54) METHOD FOR COMPARING PACKAGE EMI PERFORMANCE AT MULTIPLE CLOCK SPEEDS

(75) Inventor: Komarapalayam Velayudham Karikalan Sampath, Singapore (SG)

(73) Assignee: Advanced Micro Devices, Inc., Sunnyvale, CA (US)

( * ) Notice: Subject to any disclaimer, the term of this patent is extended or adjusted under 35 U.S.C. 154(b) by 18 days.

(21) Appl. No.: 09/598,463

(22) Filed: Jun. 22, 2000

(51) Int. Cl.[7] .............................................. G01R 31/302
(52) U.S. Cl. ..................... 324/750; 324/765; 324/158.1
(58) Field of Search ................................. 324/750, 765, 324/72.5, 158.1, 627, 95; 361/139, 816, 878

(56) References Cited

U.S. PATENT DOCUMENTS

RE35,644 E * 10/1997 Rogers ......................... 324/72
6,201,403 B1 * 3/2001 Rollin et al. ................ 324/765
6,242,925 B1 * 6/2001 Schutten et al. ............ 324/627

FOREIGN PATENT DOCUMENTS

JP 11-262330 * 9/1999

* cited by examiner

*Primary Examiner*—Ernest Karlsen
*Assistant Examiner*—Minh N. Tang

(57) ABSTRACT

A method for characterizing EMI performance of an integrated circuit (IC) device provides a testing methodology that considers the IC's performance at a number of operating speeds. The IC is operated at a plurality of operating, or core, speeds and EMI emissions data are measured at a number of frequencies for each such core speed. An EMI characterization of the device is then formed using these measured EMI emissions data; the resulting EMI characterization is based on the emissions data of the device at more than a single operating speed and thus provides a meaningful measure of its EMI performance.

16 Claims, 5 Drawing Sheets

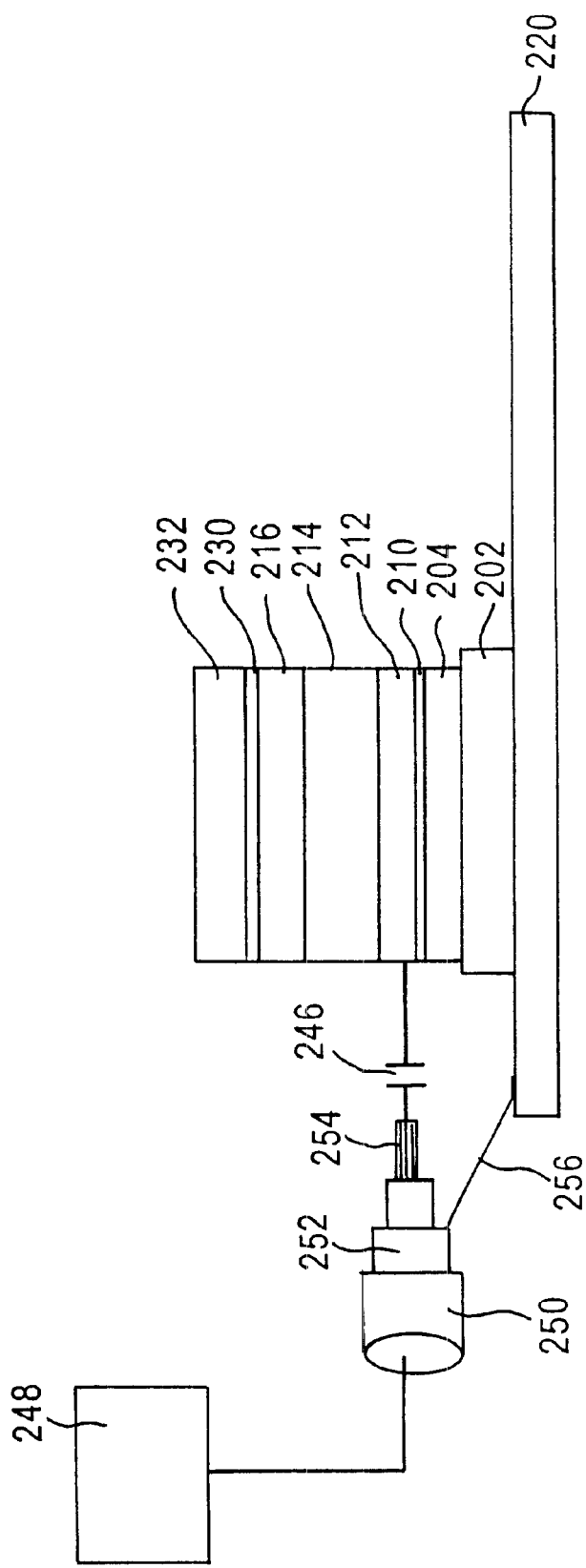

METHOD FOR COMPARING PACKAGE EMI PERFORMANCE AT MULTIPLE CLOCK SPEEDS

FIELD OF THE INVENTION

The present invention relates to electromagnetic interference measurements (EMI) of digital systems and, more particularly, to EMI characterization of integrated circuits (ICs) at multiple clock speeds.

BACKGROUND OF THE INVENTION

Electromagnetic radiation emitted from a digital system is mainly at the fundamental frequency of its switching operation and that frequency's harmonics; for systems with multiple clocks, multiple fundamental frequencies and harmonics will be present. At other frequencies, system radiation levels are typically undetectable.

International as well as national regulatory standards exist which specify allowable levels of EMI emissions from unintentional radiators. The main purpose of these standards is to protect the radio frequency spectrum for equipment licensed to operate at appropriate frequencies. Because the regulated frequencies reach into the gigahertz range and the allowable signal levels are typically in the microvolt range, the test set-up when measuring EMI often influences the test results. Therefore, in addition to allowable signal levels, these regulations also specify measuring methods in an attempt to standardize the compliance tests and improve their repeatability. These factors increase both the length and cost of typical EMI tests.

Typically, EMI regulations directly apply only to full systems, such as a personal computer, and not directly to system components, such as video cards or microprocessors. An accepted industry practice, however, to test the electromagnetic compatibility (EMC) of system components is to use the "substitution method". In this method, a compliant system is used, and an original component is replaced with a new component. If the system is still compliant, then the new component is determined to be electromagnetically compatible.

Because the microprocessor is one of the major contributors to system level EMI, EMC assessment of microprocessors is a concern of CPU manufacturers. This assessment encompasses two facets: verification of compliance to EMC standards and component characterization. When performing the substitution method to verify EMC compliance, multiple tests of multiple components on multiple systems are needed to provide any degree of confidence in the test results. Component characterization, the other facet of EMC assessment, identifies the effects that design choices have on EMI emissions. For purposes of characterization, a high number of package design options (e.g., package layer stack-up, chip-cap configuration, etc.) are evaluated and compared to arrive at valid manufacturing decisions.

One common feature of both facets is the large number of tests which need to be performed in order to properly assess a microprocessor's EMC. The far-field tests typically used for radiated emission measurements are both time consuming and expensive and the component industry needs an alternative method to perform EMC assessment. The Society of Automotive Engineers in developing their standard SAE J1752-1, entitled "EMC Measurement Procedures for Integrated Circuits", has investigated using near-field EMI measurement methods for ICs; but these methods typically involve specially manufactured test boards attached to a modified Transverse Electromagnetic Mode (TEM) cell and introduce measurement errors when operated above one gigahertz. Other near-field measurement methods are also known but have the drawbacks that repeatable measurements are difficult to obtain and measurements above 1 GHz are outside the range of current near-field probes.

Regardless of the method in which EMI data is acquired, the current method of testing EMI performance of different packages involves operating the package at a single operating speed, or core speed, and measuring the resulting EMI emissions at a number of individual frequencies (i.e. spot frequencies). The measured data is linearly interpolated to fill in the gaps between the spot frequencies. When the relative EMI performance of two or more packages is desired, the data collected for each package is compared. This method of testing and comparing package EMI data has a number of shortcomings; in particular, the EMI performance of a package operating at one core speed is not necessarily a good indicator of its performance at other core speeds. A measure of EMI performance of an integrated circuit which considers performance at a number of different core speeds is necessary.

SUMMARY OF THE INVENTION

The present invention addresses the need for an improved EMI testing method which not only considers EMI performance of an integrated circuit operated at a single speed but also considers the EMI performance at other operating speeds.

This, as well as other needs, are met by the present invention which provides a novel method of testing integrated circuits at a number of clock speeds and then forming an EMI characterization of the IC based on its EMI performance at the different clock speeds. The resulting EMI characterization allows more meaningful comparisons between an IC's different EMI performances than the previous method of collecting EMI emission data while operating an IC at only a single operating speed.

The needs are also met by embodiments of the invention which measure EMI emissions of an IC operated at a first core speed, measure EMI emission of the IC operated at a second core speed, and then use the EMI emissions data from these two speeds to form a characterization of the IC's EMI performance.

The foregoing features, as well as other aspects and advantages, of the present invention will become more apparent from the following detailed description, claims and drawings.

BRIEF DESCRIPTION OF THE DRAWINGS

FIGS. 2a through 2c illustrate different test system set-ups in accordance with embodiments of the present invention.

DETAILED DESCRIPTION OF THE INVENTION

An embodiment of the present invention is presented below specifically in terms of a CPU or microprocessor within a computer system. However, the scope of the present invention also includes similar ICs and systems other than this specific embodiment. Similarly, the term "core speed" is used throughout the following description of the present invention; this term is usually used in reference to CPUs, but, within the present description, is intended to encompass within its meaning the operating speed of an IC, whether or not the IC is a CPU.

Figure 1:
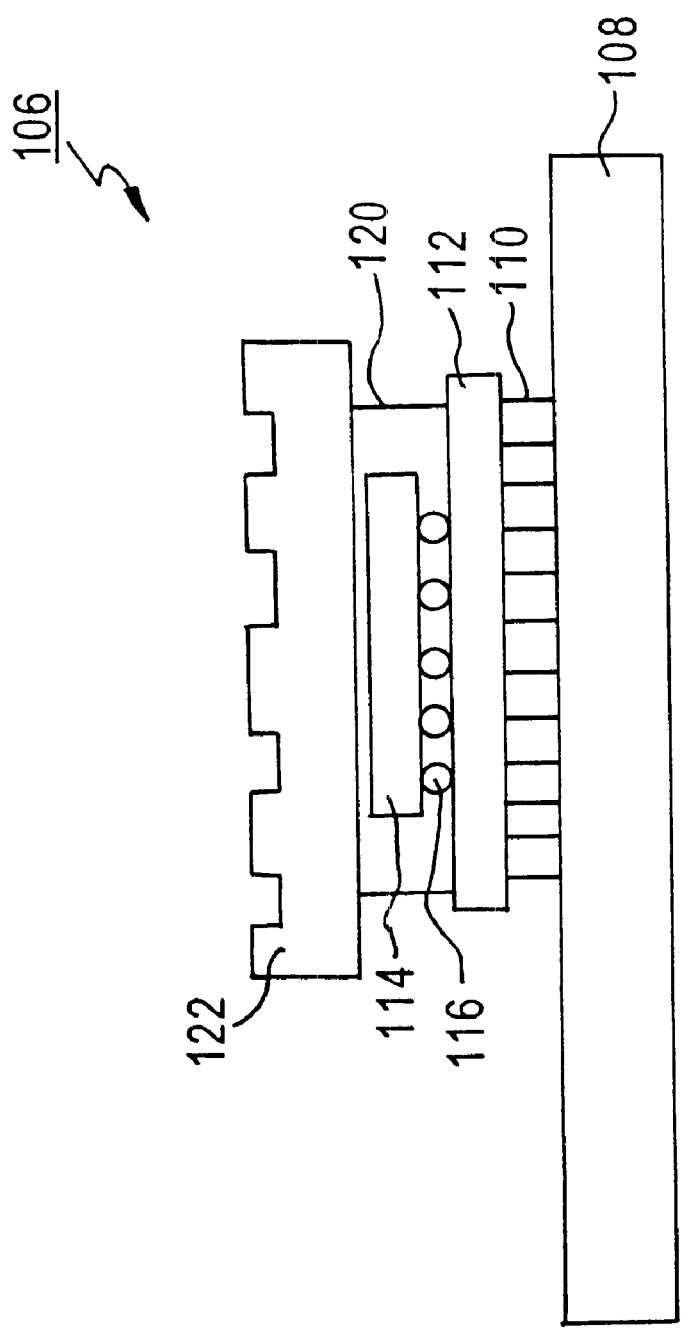
FIG. 1 illustrates a typical IC package for which the present invention performs EMI measurements.

A CPU device 106 as depicted in FIG. 1 includes pins 110, or other connectors, for electrically coupling the device 106 to a motherboard 108, or other circuit board. The device 106 also includes package substrate 112, die 114, and solder bumps, pads or pins 116 for connecting die 114 and conducting traces (not shown) on substrate 112. The lid 120 seals and protects die 114 and its connections 116 to substrate 112 and provides a mounting surface for heat sink 122. The region between a lid 120 and substrate 112 may be filled with a resin or similar material for both its protective and thermal properties. FIG. 1 is only an exemplary IC; the present invention is not limited to the particular flip-chip arrangement depicted therein, other IC package types as known in the art are also contemplated within its scope.

Substrate 112 and connectors 110 are sometimes referred to as an IC package. For EMI measurement purposes, an IC package is basically a passive structure and the EM radiation depends on the harmonic contents of the currents that are flowing in it. The "package plus die" combination of a microprocessor contributes to the EMI performance of a computer system in the following two ways: direct radiation from the die and package through the heat sink assembly; and noise introduction into the supply and ground planes and the resulting radiation of this noise from the motherboard PCB traces and power cable.

At frequencies other than the core and I/O clocks and their harmonics, the influence of the microprocessor on the overall system EMI performance is negligible.

Far-field measurements of system EMI emissions which are used to compare CPU designs or perform EMC verifications are both costly and time consuming because of the testing equipment, set-up and procedures needed to acquire reproducible measurements. These disadvantages are only compounded when many measurements are required to obtain meaningful data.

One aspect of the present invention provides a novel method to measure the EMI emitted by the IC device. RF noise voltage available on the lid 120 covering the CPU device 106, measured with respect to the system's ground, is used as a measure of the CPU's emitted EMI. There are a number of justifications for using the lid 120 in this manner. First, the lid 120 of the CPU device 106 acts as a closely and precisely positioned sensor which capacitively couples the radio frequency (RF) energy from the die 114 and package, while remaining insulated from the die 114 and package. Also, because the energy at the lid 120 is what is coupled to the heat sink 122 and ultimately radiated, the voltage difference between the lid 120 and ground is a good indicator of the "die and package" radiation for a given motherboard, while considerably isolating the contribution of other sub-systems like the power supply and VGA cards. Third, the precise positioning of the lid 120 on each CPU device 106, as compared to a near-field probe introduced during testing, allows more stable and reproducible data. Also, the manufacturing tolerances of dies, and thus the transmission lines within a package, are very precise. Therefore, any change in the RF potential signature on the lids 120 for CPU devices 106 with various package design options, are mainly attributable to changes in package design.

Figure 2A:
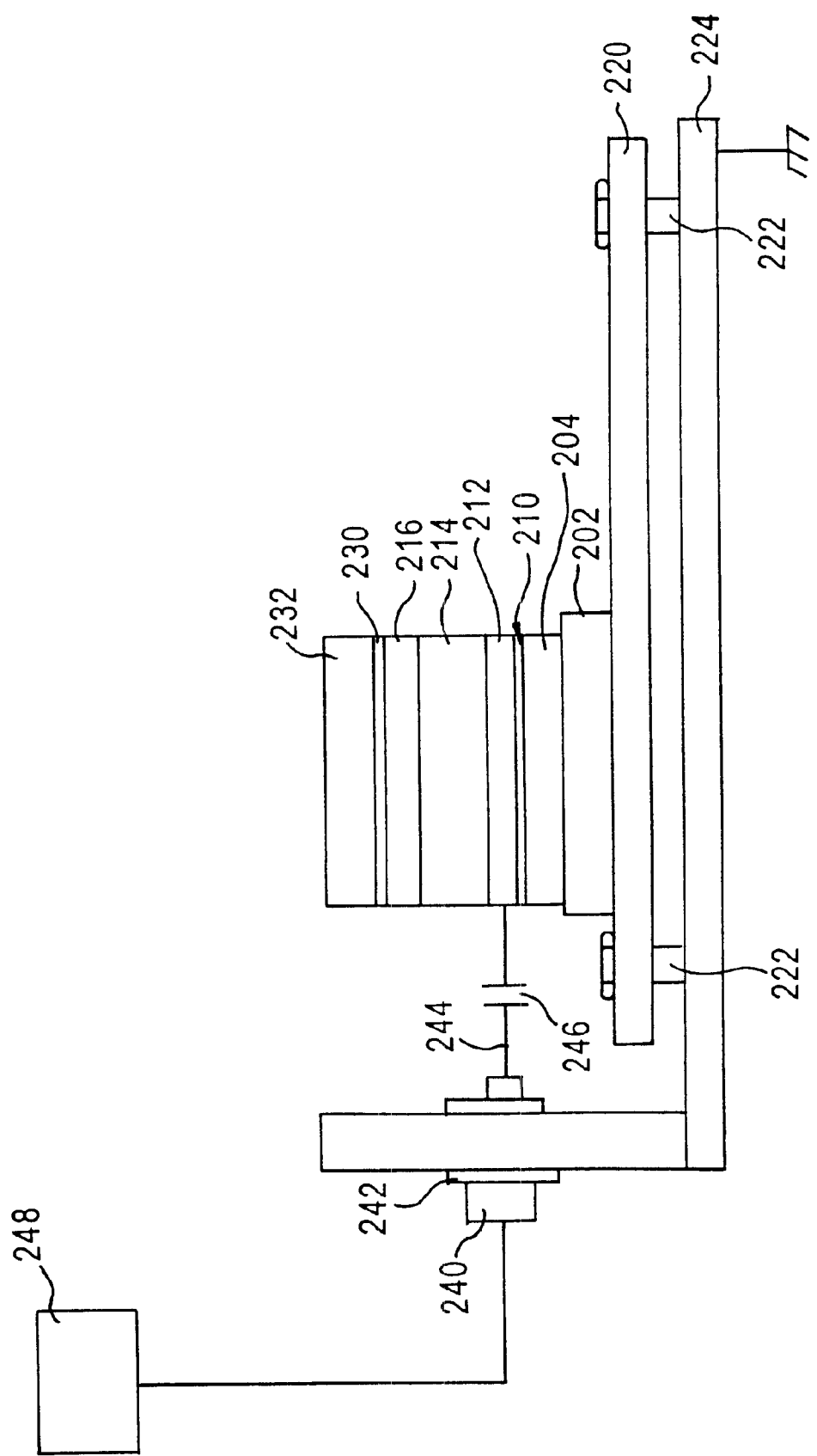

FIG. 2a illustrates an exemplary embodiment in accordance with the present invention for indirectly measuring the RF voltage available on an IC's lid. Instead of directly measuring the lid potential, the set-up depicted in FIG. 2a allows coupling, through mutual impedance coupling, of the RF noise voltage from a lid 210 to a connected conductor 212. In this arrangement the lid 210 and conductor 212 are both inductively and capacitively coupled (i.e. mutually impedance coupled) and the coupled energy indicates the noise that would have been coupled to the heat sink in a similar manner.

In the mutual impedance coupling (MIC) measurement set-up of FIG. 2a, a motherboard 220 is supported by spacers 222 and has its '0 volts' connected through metal reference plane 224 to ground. This arrangement simulates the presence of a typical PC chassis. Socket 202 accepts a CPU or other IC 204 which has a lid 210 physically adjacent to a conductor 212. There are many known methods of securing heat sinks to microprocessors including various clips, clamps and adhesives. The present invention uses similar methods to secure the lid 210 and conductor 212 as well as to secure conductor 212, heat sink 214 and fan 216. Alternative connection methods include adding a weight 232 on top of heat sink 214 to operatively, but temporarily, connect the lid 210, conductor 212 and heat sink 214. In this alternative, a brass grille 230 is interposed to help isolate weight 232 from the fan 216.

In certain embodiments, conductor 212 is constructed of copper and has substantially the same dimensions as CPU 204. As for the thickness, conductor 212 is preferably small compared to the wavelength of the highest frequency being measured; otherwise, the coupled noise voltage may vary depending on the location of the measurement of the conductor 212. In certain embodiments of the present invention, the conductor 212 is shaped to fit the shape of lid 210 to better facilitate coupling of the RF potential and to assist with heat dissipation.

A coaxial connector 240 provides connection between a spectrum analyzer 248 and the conductor 212. The outer conductor 242 of the connector 240 is electrically connected to the metal reference plane 224. The inner conductor 244 of connector 240 is connected through a DC blocking capacitor 246 to conductor 212. The connections between conductor 212, capacitor 246 and connector 240 are accomplished using conventional soldering methods.

FIG. 2b illustrates another test set-up embodiment of the present invention. In this arrangement, coaxial cable 250 is used to connect conductor 212 to spectrum analyzer 248. Specifically, the outer conductor 252 of cable 250 is electrically connected to '0 volts' of the motherboard 220 and the inner conductor 254 is connected through the blocking capacitor 246 to conductor 212.

Figure 2C:
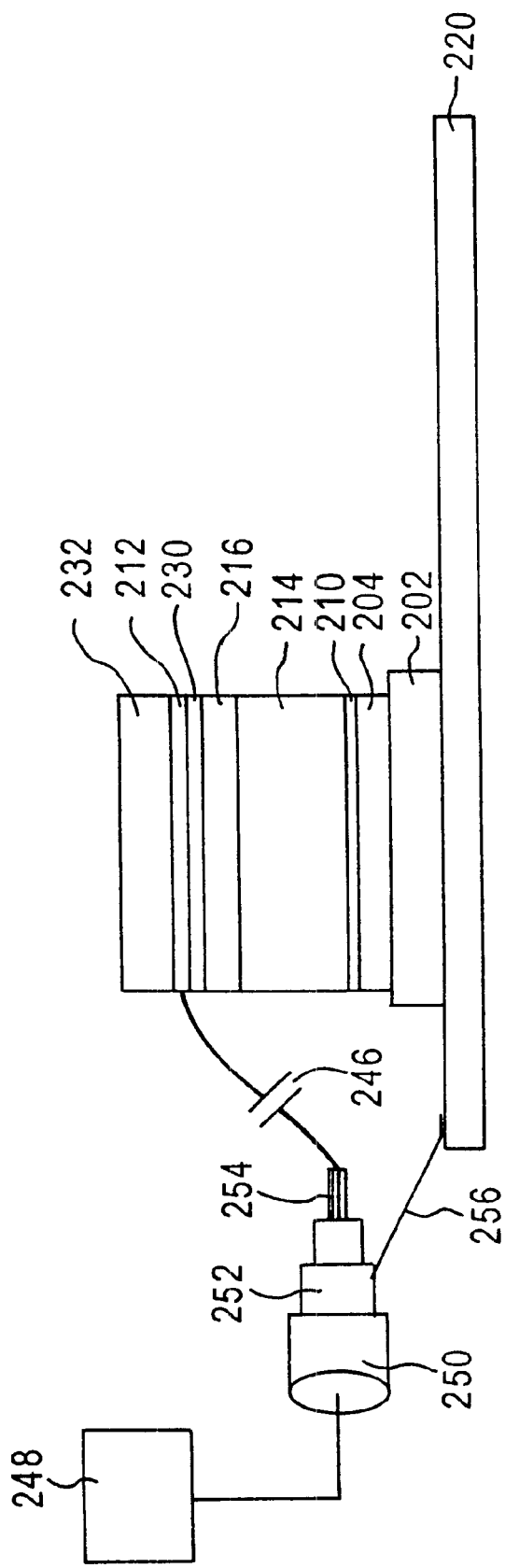

FIG. 2c illustrates another test set-up embodiment which positions conductor 212 differently than the previous two figures. In this embodiment, the conductor 212 is inserted between the weight 232 and brass grille 230 instead of being physically adjacent to lid 210. The spectrum analyzer 248 still measures the voltage potential mutually impedance coupled to conductor 212 which, even in this arrangement, remains an indication of the RF noise energy on the lid 210.

In acquiring EMI data for a device, the RF energy at lid 210 is coupled to conductor 212, through mutual impedance coupling, and measured by a spectrum analyzer or other meter connected through connector 240 or coaxial cable 250.

The test set-ups depicted in FIGS. 2a–2c depict novel arrangements to measure the EMI emitted by an IC device. As discussed previously, other methods of acquiring EMI emissions data are also known. Various far-field and near-field techniques are available to acquire EMI emissions data on a device in a digital system. As previously indicated, however, the present method of characterizing the EMI performance of a device takes into account the EMI emissions, regardless of the measurement method, from the device operating at more than a single clock speed. When collecting EMI data, whether using far-field, near-field, or the novel MIC method described earlier, the device packages being tested are placed in a computer system, or motherboard, and operated at a number of different speeds. One embodiment of the present invention uses separate motherboards having a fixed clock and operating a package rated for that fixed clock speed. Another embodiment utilizes a motherboard with adjustable clock circuitry which operates a single device package at a number of different speeds.

Operating an integrated circuit (IC) package at a particular clock speed (i.e. core speed) makes the harmonics of the core clock current flow in particular layers of the package. In the case of some ICs, the harmonics of an I/O clock current flow in other layers as well. The resulting EMI performance of the package depends on how these current harmonics are distributed in the package layers. While multiple factors affect the overall EMI performance of an IC package, a major contributor is the noise level on the package lid which gets radiated out or coupled to an attached heat and then radiated out. One significant influence of the noise level that is available at a package lid is the current distribution on the surface of the top-most metal layer, or plane, of the package.

Thus, when a package having, for example, Vcc2 as a top layer is run at 400 MHz, significant components of its radiation will be at the frequency spots of 400 MHz, 800 MHz, 1200 MHz, 1600 MHz, etc. as well as I/O harmonics of 100 MHz, 200 MHz, 300 MHz, 400 MHz, etc. The exact amplitude at each of these spot frequencies depends on the source current at that spot as well as the radiating efficiency of the package structure at that spot.

If the EMI performance of two packages as described above, both operating at 400 MHz, are compared then the data could indicate that at 1400 MHz one package performs better than another. However, this indication is, at best, suspect because 1400 MHz is not a harmonic of 400 MHz and no current flows, in this example, at 1400 MHz on the top-layer Vcc2 plane. Whereas, at the core speed of 350 MHz, the 4th harmonic core currents at 1400 MHz flow on the top Vcc2 layer and the data for comparison can now correctly account for the current distribution at this frequency as well as the package radiating efficiency at this frequency.

For EMI performance comparison, therefore, the test methodology of the present invention runs devices under test at various core speeds to force currents on the top layer at most of the significant frequencies in the test frequency band. In one embodiment, the worst case emission at each frequency spot, among all the operating core speeds, is used when comparing package EMI performance.

Figure 3:
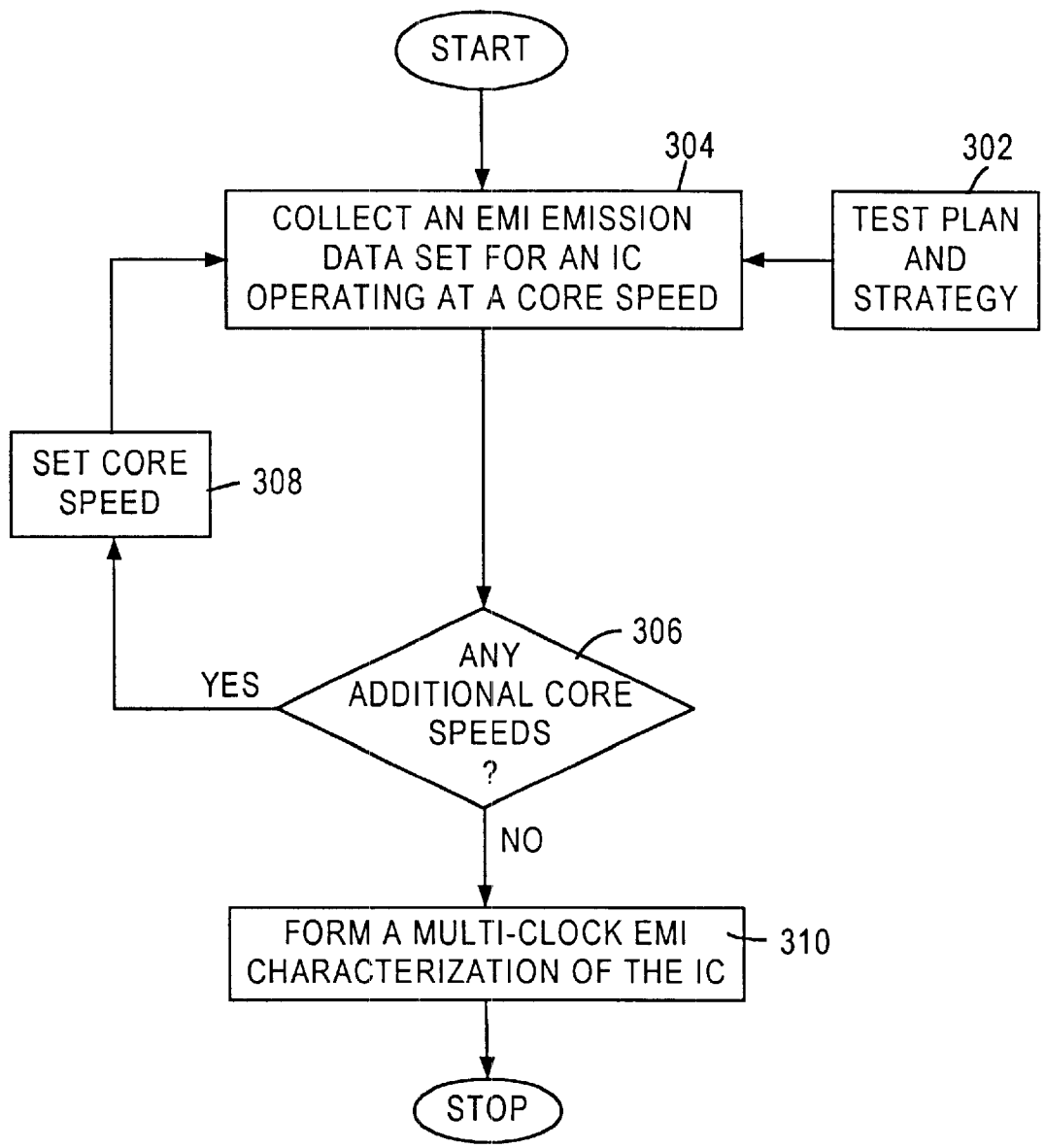
FIG. 3 illustrates a flowchart depicting a method for testing EMI performance of an IC device at multiple core speeds in accordance with the present invention.

FIG. 3 depicts a flowchart of performing an exemplary test according to the methodology of the present invention.

In step 304, an IC is operated at a core speed and EMI emissions data at a number of frequencies are captured. The novel method of measuring the mutually impedance coupled voltage potential of a conductor, described earlier, is one method of acquiring this EMI data. Near-field EMI scans as well as far-field techniques are also known methods of acquiring EMI data contemplated within the scope of the present invention.

Previous to conducting any measurements, a test plan or strategy is developed, in step 302, which determines the core speeds and the spot frequencies to use when performing the data collection of step 304. The core speeds are selected to provide spot frequency points that are distributed across the range of frequencies of interest. Also, if an I/O clock is involved then the spot frequencies include harmonics of this clock as well. An exemplary test plan is shown below.

| Core Clock Speed | Core Harmonic Spots of Measurement | I/O Harmonic Spots of Measurement |
| --- | --- | --- |
| 350 MHz | 350, 700, 1050, 1400 and 1750 MHz | 100, 200, 300, 400, 500, 600, 800, 900, 1000, 1100, 1200, 1300, 1500 and 1600 MHz |
| 400 MHz | 400, 800, 1200, 1600 and 2000 MHz | 100, 200, 300, 500, 600, 700, 900, 1000, 1100, 1300, 1400 and 1500 MHz |
| 475 MHz | 475, 950, 1425, 1900 MHz | 95, 190, 285, 380, 570, 665, 760, 855, 1045, 1140, 1235, 1330 and 1520 MHz |

Once emission data at all spot frequencies are collected, for a given core speed, a branch of the test determines, in step 306, if any more core speeds remain to be tested. If so, then a new core speed is set in step 308 and the data collection of step 304 is repeated according to the test plan of step 302.

Once EMI data collection has occurred for all the required core speeds, an EMI characterization of the IC is formed in step 310. This characterization is based on the EMI emissions data collected at a variety of core speeds; unlike previous testing methods which relied on data collected for only a single operating speed.

Using known statistical methods, the EMI data from the multiple core speeds can also be weighed and combined in different ways to form a composite EMI characterization of the IC. Alternatively, a method of selecting the IC's worst-case performance for each spot frequency, regardless of core speed, can also be used as a way to form the IC's EMI characterization.

The present invention addresses the need for an EMI test method which considers a device's performance at a number of operating speeds. Because EMI emissions typically are at harmonic frequencies of an operating speed, an EMI test method which relies on emissions data resulting from only a single operating speed is an incomplete and misleading method for characterizing devices. The test method of the present invention, which collects data from a device operated at a plurality of core speeds and uses this data to characterize the device, provides a more complete and meaningful measure of the device's EMI performance.

Although the present invention has been described and illustrated in detail, it is to be understood that the same is by way of illustration and example only and is not to be taken by way of limitation, the scope of the present invention being limited only by the terms of the appended claims.

What is claimed:

1. A method of testing an electromagnetic interference EMI performance of an integrated circuit (IC) comprising the steps:

operating the IC at a first core speed;

measuring a first set of EMI emissions data of the IC when operated at the first core speed;

operating the IC at a second core speed;

measuring a second set of EMI emissions data of the IC when operated at the second core speed; and characterizing the EMI performance of the IC according to the first and second sets of EMI emissions data.

2. The method of claim 1, wherein the step of characterizing the EMI performance of the IC includes the step:

forming a composite EMI performance value as a function of the first and second sets of EMI emissions data.

3. The method of claim 2, wherein the step of forming a composite EMI performance value includes the step:

combining the first and second sets of EMI emissions data into a single set of data.

4. The method of claim 1, wherein the step of measuring the first set of EMI emissions data includes measuring EMI emissions at a first plurality of spot frequencies; and the step of measuring the second set of EMI emissions data includes measuring EMI emissions at a second plurality of spot frequencies.

5. The method of claim 4, wherein the step of characterizing the EMI performance of the IC includes the step:

selecting from said first and second sets of EMI emissions data the worst-case EMI emission data for each frequency within the first and second pluralities of spot frequencies.

6. The method of claim 1, wherein:

the step of measuring the first set of EMI emissions data includes measuring EMI emissions at a plurality of harmonics of the first core speed; and the step of measuring the second set of EMI emissions data includes measuring EMI emissions at a plurality of harmonics of the second core speed.

7. The method of claim 6, wherein:

each of the plurality of harmonics comprise the first through the tenth harmonic.

8. The method of claim 1, wherein:

the step of measuring the first set of EMI emissions data includes measuring EMI emissions at a plurality of harmonics of a first I/O clock speed; and the step of measuring the second set of EMI emissions data includes measuring EMI emissions at a plurality of harmonics of a second I/O clock speed.

9. The method of claim 8, wherein:

the first and second I/O clock speeds are different.

10. The method of claim 1, wherein the steps of measuring a first and second set of EMI emissions data of the IC each includes the step:

measuring a near-field radiated EMI level of the IC.

11. The method of claim 1, wherein the steps of measuring a first and second set of EMI emissions data of the IC each includes the step:

measuring a far-field radiated EMI level of the IC.

12. The method of claim 1, wherein the steps of measuring a first and second set of EMI emissions data of the IC each includes the step:

measuring an RF noise level on a lid of the IC.

13. The method of claim 12, wherein the step of measuring an RF noise level further comprises the step of:

measuring a voltage potential which is inductively and capacitively coupled to a conductor operatively attached to the lid.

14. The method of claim 1, wherein the IC is a microprocessor.

15. A method of testing an EMI performance of a microprocessor comprising the steps:

operating the microprocessor at a first core speed;

measuring a first set of EMI emission data of the microprocessor when operated at the first core speed, wherein the first set comprises EMI emission datum measured at a plurality of harmonics of the first core speed;

operating the microprocessor at a second core speed;

measuring a second set of EMI emission data of the microprocessor when operated at the second core speed, wherein the second set comprises EMI emission datum measured at a plurality of harmonics of the second core speed; and characterizing the EMI performance of the microprocessor by forming a composite EMI performance value as a function of the first and second sets of EMI emission data.

16. The method of claim 15, wherein:

the step of measuring the first set of EMI emissions data includes measuring EMI emissions at a plurality of harmonics of a first I/O clock speed; and the step of measuring the second set of EMI emissions data includes measuring EMI emissions at a plurality of harmonics of a second I/O clock speed.

* * * * *